United States Patent [19]

Takahashi et al.

[11] Patent Number: 5,500,587
[45] Date of Patent: Mar. 19, 1996

[54] E-O PROBE

[75] Inventors: Hironori Takahashi; Shinichiro Aoshima; Isuke Hirano, all of Hamamatsu, Japan

[73] Assignee: Hamamatsu Photonics K.K., Hamamatsu, Japan

[21] Appl. No.: 118,257

[22] Filed: Sep. 9, 1993

[30] Foreign Application Priority Data

Sep. 10, 1992 [JP] Japan .................................. 4-242134

[51] Int. Cl.⁶ ................................................. G01R 31/00
[52] U.S. Cl. .......................... 324/96; 324/753; 324/752; 359/247; 359/248; 359/263
[58] Field of Search ........................... 324/753, 96, 752; 359/247, 248, 263

[56] References Cited

U.S. PATENT DOCUMENTS

| | | |
|---|---|---|
| 4,618,819 | 10/1986 | Mourou et al. . |
| 4,864,220 | 9/1989 | Aoshima et al. .......................... 324/96 |
| 4,873,485 | 10/1989 | Williamson . |
| 4,982,151 | 1/1991 | Takahashi et al. ......................... 324/96 |
| 4,996,475 | 2/1991 | Takahashi et al. ......................... 324/96 |

FOREIGN PATENT DOCUMENTS

| | | |
|---|---|---|
| 0293922 | 12/1988 | European Pat. Off. . |
| 0297562 | 1/1989 | European Pat. Off. . |
| 0541139 | 5/1993 | European Pat. Off. . |
| 2208710 | 4/1989 | United Kingdom . |

OTHER PUBLICATIONS de Kort et al., "Waveform Measurements with Calibrated Amplitude by Electro–Optic Sampling in IC's," Microelectronic Engineering 16 (1992), 341–348.

*Primary Examiner*—Kenneth A. Wieder
*Assistant Examiner*—Kourosh Cyrus Khosravi
*Attorney, Agent, or Firm*—Cushman Darby & Cushman

[57] ABSTRACT

An E-O probe with improved spatial resolution has a light transmissive base part, an electro-optic material which is fixed to the base part and has an index of refraction which varies in response to an electrical field from a measured object, and a mirror which is fixed to the electro-optic material and reflects an incident beam penetrating the base part and the electro-optic material. The mirror is formed to be smaller than the incident beam in diameter. The electro-optic material is formed very thin.

15 Claims, 9 Drawing Sheets ns 5,500,587

E-O PROBE

BACKGROUND OF THE INVENTION

1. Field of the Invention

The present invention relates to an E-O probe applied to a voltage detecting apparatus which measures without electrical contact a voltage of a measured object, by detecting a strength of an electrical field generated from the measured object, and particularly to an E-O probe with a structure which enables its spatial resolution to be improved.

2. Related Background Art

There are some apparatus known as a voltage detecting apparatus which measures without electrical contact a voltage of a measured object, making use of such an E-O Probe. For example, see U.S. Pat. No. 4,618,819. In those apparatus, E-O probe is made of an electro-optic material such as $LiTaO_3$ which has an electro-optic effect causing an index of refraction to vary in response to an intensity of an electrical field generated from a measured object.

Referring to FIG. 7, the principles of such a voltage detecting apparatus are described hereunder. The E-O probe includes an electro-optic material 1 formed as a quadrangular pyramid or the like with a flat face at the top end, and a reflecting mirror 2 attached to the flat face with the reflecting face facing the flat face, and during measuring the mirror 2 is kept in the proximity of the measured object 3. An incident beam hv1 polarized as linearly polarized, circularly polarized or ovally polarized light enters the electro-optic material 1, being directed to the reflecting mirror 2, from the other side of the material 1. A light hv2 reflected by the mirror 2 is converted to a light intensity by a polarization analyzing means and further the light intensity is measured by a photo-electric converting element. Since the electro-optic material 1 has a characteristic that an index of refraction varies in response to the intensity of an electrical field caused by a voltage at the measured object 3, the polarization status of the reflected light hv2 is changed from the incident beam hv1, and when the reflected light hv2 is measured with a polarizing beam splitter and a photodetector, a voltage at the measured object 3 can be detected. Where, the photo-detector is of photo-electric effect such as a photomultiplier tube, a high responsivity charge coupled device and the like.

As mentioned above, since a voltage of a measured object is measured optically based on an intensity of an electrical field from a measured object, a non-contact measurement is possible. This is especially efficient in such a case as measuring a signal voltage at each wire, electric line, electrode or element in a semiconductor chip and determining an operation characteristic of the semiconductor chip.

Recent advances in high-density device technologies of semiconductor integration circuits are requiring an extremely narrower space between wires of the circuits. And further improvement in spatial resolution is desired so as to enable a signal voltage propagating in each wire to be measured with high precision without being affected by an electrical field from each other wire.

Where $\lambda$ is a wavelength of an incident beam hv1 emitted by a semiconductor laser or the like, NA is a numerical aperture of an objective lens to be used for focusing and $a_0$ is a diameter of the incident beam hv1 reflected by a reflecting mirror 2, the formula $a_0=(2\times\lambda)/(\pi\times NA)$ is met. It means the shorter the wavelength of an incident beam hv1 is, the smaller the diameter $a_0$ is, and consequently the higher spatial resolution is attained. For example, in a case of $\lambda=780$ nm and NA=0.4, $a_0$ is 1.2 µm, and a voltage at a wire in a circuit with a close space of 1.2 µm or larger between wires on a semiconductor chip can be measured without any contact. Actually, this is a theoretical minimum beam diameter to be calculated based on a wavelength of an applied light and it is difficult to realize the minimum value due to aberration and wave front distortion of optical elements such as lens.

As described in the formula above, the highest spatial resolution is now limited to about 1 µm which can not sufficiently satisfy the requirements in response to the recent advance in fine semiconductor processing technologies.

Further, no attention has been paid to the thickness of the electro-optic material 1 (the height of the quadrangular pyramid), and a relatively thick material was used. Under the circumstances, an overall polarization status of the electro-optic material 1 varies even when the tip portion of the electro-optic material 1 is not just above the place to be measured of the measured object 3, since the other part than the tip portion is also placed under the influence of the electrical field from the measured object 3 as illustrated in FIG. 8. It results in a difficulty to achieve a high spatial resolution. With a thick electro-optic material 1, a polarization status would vary in response to an electrical field from the measured object 3 not only in the tip portion of the electro-optic material of E-O probe but also in the body portion of the electro-optic material 1, even when the tip portion is not just above the measured point on the measured object 3.

SUMMARY OF THE INVENTION

It is an object of the present invention to provide an E-O probe for measuring a voltage on a measured object by applying a light, comprising a base part which is penetrated by the light, an electro-optic material which is attached to an end face of the base part facing the measured object and an index of refraction of which varies in response to an intensity of an electrical field from the measured object, and a reflecting face which is fixed to an end face of the electro-optic material facing the measured object and reflects an incident beam penetrating the electro-optic material from the base part, where the reflecting face is formed of a smaller mirror than a beam diameter of the incident beam.

It is another object of the present invention to provide an E-O probe with a light absorbing layer around the mirror which prevents a light entering to an outside of the mirror from being reflected.

It is still another object of the present invention to provide an E-O probe with a light diffusing layer which is disposed around the mirror.

It is yet another object of the present invention to provide an E-O probe where a thickness of the electrooptic material is formed equal to or smaller than a theoretical minimum beam diameter to be calculated based on a wavelength of said applied light.

According to the present invention with the structure as described above, an actual spatial resolution is determined by a size of the reflecting mirror since an incident beam is reflected by the smaller reflecting mirror than the incident beam in diameter even when no desired spatial resolution can attained with a beam diameter determined based on a wavelength of the incident beam ($a_0=(2\times\lambda)/(\pi\times NA)$). Conventionally a further improvement in a spatial resolution was very hard since a possible beam diameter is limited by a wavelength of an applied light as an incident beam, aberration and wave front distortion of optical elements. However, according to the present invention where an incident beam is reflected by a smaller reflecting mirror in diameter than the incident beam, a spatial resolution can be improved exceeding the limit.

Forming an electro-optic material as thin as the size of the reflecting mirror or a theoretical minimum beam diameter to be calculated based on a wavelength of said applied light, an electrical field from a measured object little affects an electro-optic material before the electro-optic material comes just over the measured object, and consequently a spatial resolution can be improved.

BRIEF DESCRIPTION OF THE DRAWINGS

The foregoing and other objects, features and advantages of the invention, as well as a presently preferred embodiment thereof, will become more apparent from a reading of the following description in connection with the accompanying drawings in which.

DETAILED DESCRIPTION OF THE PREFERRED EMBODIMENTS

Figure 1:
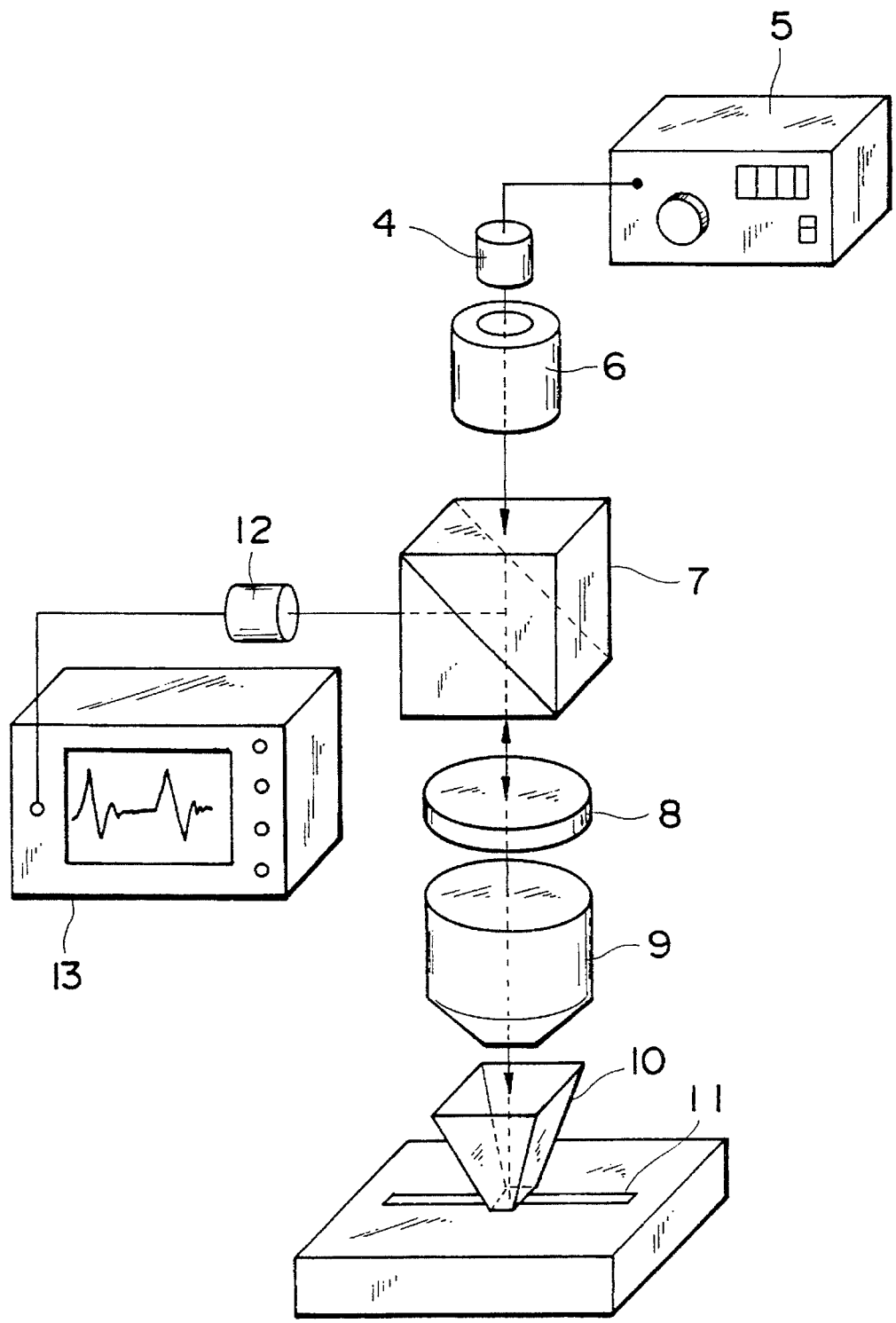
FIG. 1 shows an example of a structure of a non-contact voltage detecting apparatus with an E-O probe.

Referring to FIG. 1, an example of structure of a non-contact voltage detecting apparatus in which an E-O probe 10 of the present invention can be applied. There are a light source 4 such as a semiconductor laser and a driving apparatus 5 to supply electricity to the light source 4 disposed. A light emitted by the light source 4 passes a collimating lens 6, a polarizing beam splitter 7 and a wave plate 8 in this order. Therefore, the incident light is polarized for example to a linearly-polarized light by the polarized beam splitter 7, and further is converted to a predetermined polarized light such as a circularly-polarized light or elliptically-polarized light by the wave plate 8. This light is focused by a focusing lens 9 and enters an E-O probe 10. An electro-optic material described later and a reflecting face are disposed at a part of the E-O probe 10 facing the measured object 11, and an index of refraction of the electro-optic material varies in response to intensity of an electrical field developed by the measured object 11 such as a wire, electric line, electrode or a semiconductor device integrated in a semiconductor integrated circuit, for example when a voltage at each point of the semiconductor integrated circuit is measured. Therefore, the reflected incident beam as mentioned above passes the focusing lens 9 and the wave plate 8 as a reflected beam, in which a polarization status is determined in response to a variation of the index of refraction, and further only an polarized light element orthogonal to the incident light is separated by the polarized beam splitter 7 and enters a photo-detector 12 such as photomultiplier. The photo-detector 12 converts it to electricity by the photo-electric effect, and the converted signal is measured by a measuring instrument 13 such as an oscilloscope.

Figure 2A:
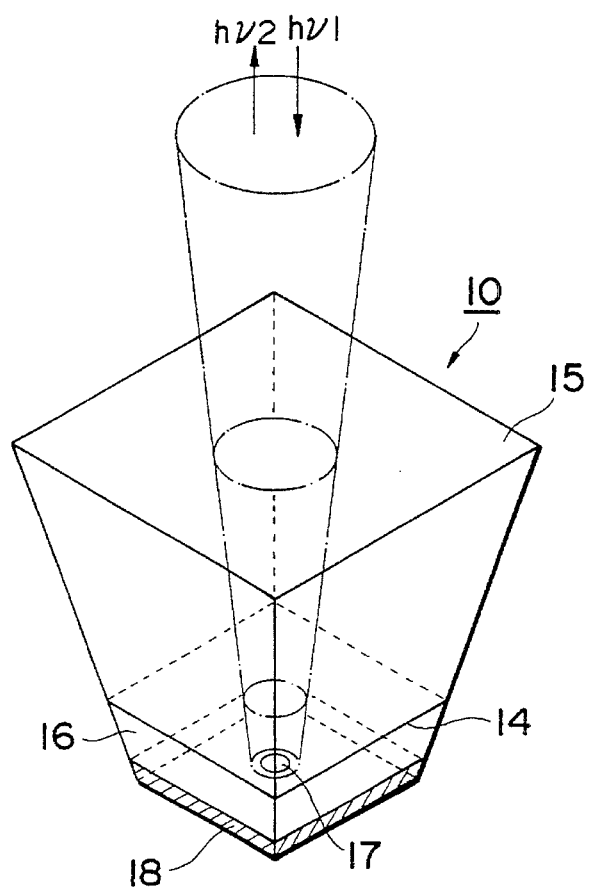
FIG. 2A and FIG. 2B are drawings describing a structure of a first embodiment of an E-O probe of the present invention.
Figure 2B:
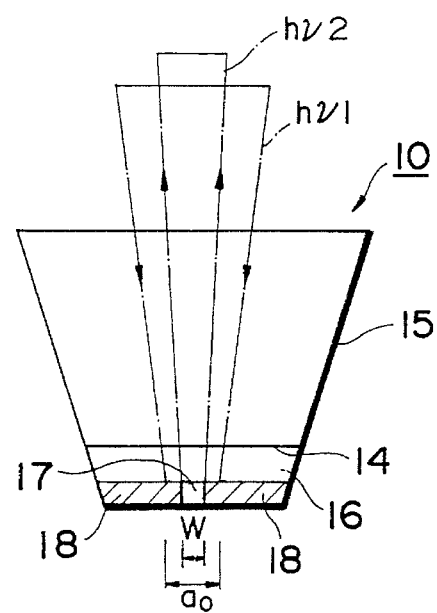

Referring to FIG. 2A and FIG. 2B, a structure of a first embodiment of an E-O probe 10 of the present invention is described. In FIG. 2A, a base part 15 of a quadrangular pyramid shape is made of a light transmissive material such as glass and has an infinitesimal flat face 14 at the measured object side. And a thin plate shaped electro-optic material 16 is attached to the flat face 14. Further as shown in a vertical cross section shown in FIG. 2B, an infinitesimal mirror 17 is provided having a reflecting face which faces the incident side of the incident beam hv1. The mirror 17 is fixed to the tip part face of the electro-optic material 16. The rest of the tip part face of the electro-optic material 16 other than the mirror 17 is covered by a light absorbing layer 18 which absorbs light incident to the outside of the mirror 17 among the incident beam hv1.

Here, a diameter w of the mirror 17 is designed to be smaller than the diameter $a_0$ of the incident beam hv1 at the tip part face of the electro-optic material 16. Therefore, the beam diameter of the reflected beam hv2 reflected by the mirror 17 is smaller than the beam diameter of the incident beam hv1.

Figure 9A:
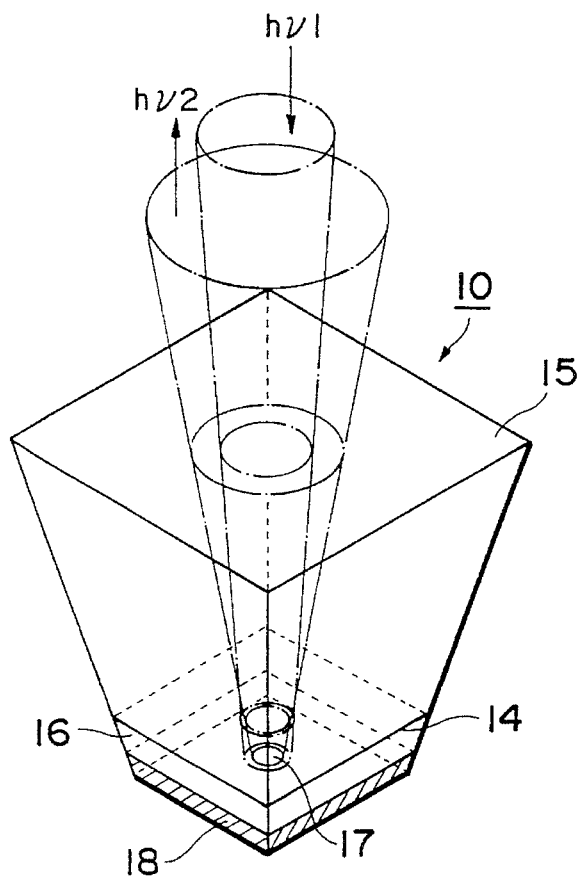
FIG. 9A and FIG. 9B are drawings describing a reflection status in a case of an extremely small diameter of an incident beam.
Figure 9B:
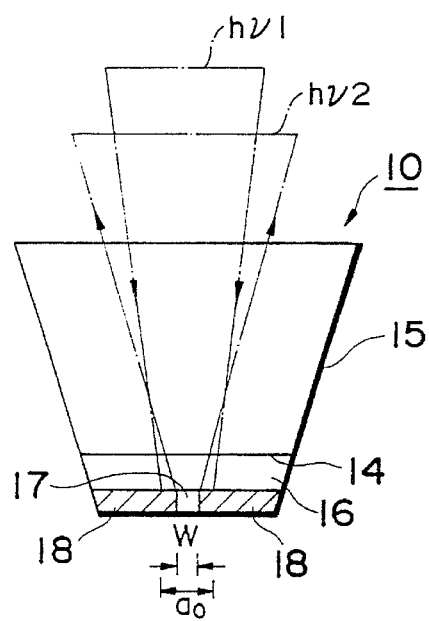

Referring to FIG. 9A and FIG. 9B, described is an embodiment in which the formation is the same as that in FIG. 2A and FIG. 2B but a diameter of a reflection mirror is equal to or smaller than a minimum possible diameter to be calculated based on a wavelength of an applied light, that is, a diffraction limit diameter. A diffraction limit d is given by the following formula, including a wavelength $\lambda$ and a numerical aperture NA of the focusing lens.

$$d=(2\times\lambda)/(\pi\times NA)$$

For example, in the case where a semiconductor laser light of $\lambda=780$ nm is focused by an objective lens of NA=0.42 and of 50 magnifications, a diffraction limit is $d=1.18$ μm. Where a diameter w of the mirror 17 is equal to or smaller than the diffraction limit, the reflected beam hv2 spreads wider than the incident beam hv1 as shown in FIGS. 9A and 9B. In this case, since a part of the reflected beam hv2 does not return to the focusing lens, an amount of light to be detected by the photo-detector 12 decreases and an output signal may be weakened. However, since the output signal is obtained from the beam reflected by the infinitesimal mirror 17, a higher spatial resolution can be attained than in case of a beam diameter $a_0$ of the incident beam hv1.

A beam diameter $a_0$ of the incident beam hv1 may not be able to be smaller than 1 μm due to a usage of a light with a wavelength which is not attenuated in an optical system of a non-contact voltage measuring apparatus as shown in FIG. 1. Even in this case, as described above, using an E-O probe 10 of the embodiment, a diameter of a reflected beam hv2 to be modulated in the electro-optic material 16 can be about equal to a diameter w of the mirror 17 which is made smaller than the beam diameter $a_0$ of the incident beam hv1.

Consequently, a spatial resolution can-be set higher than a beam diameter $a_0$ of the incident beam hv1.

More particularly, accompanying recent advances in infinitesimal processing technologies of semiconductors, wires or internal devices formed with a space of 1 μm or smaller are not rare in a semiconductor integrated circuit. According to the present invention, a voltage at each point can be detected with a spatial resolution of 1 μm or smaller to analyze a circuit operation or an abnormality such as an electrical field concentration, by detecting the voltage without any contact. Through applications like the above, the present invention can greatly contribute to the semiconductor technologies in the future.

Figure 3A:
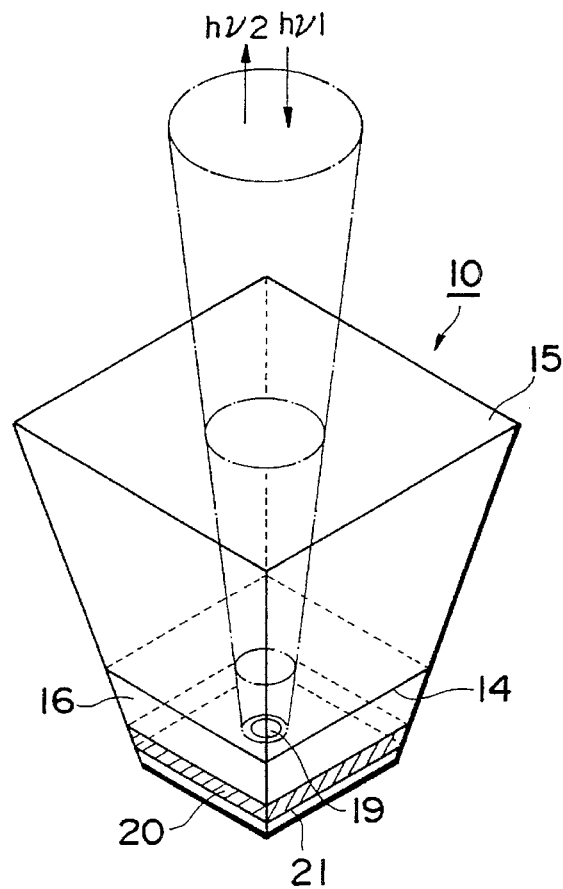
FIG. 3A and FIG. 3B are drawings describing a structure of a second embodiment of an E-O probe of the present invention.
Figure 3B:
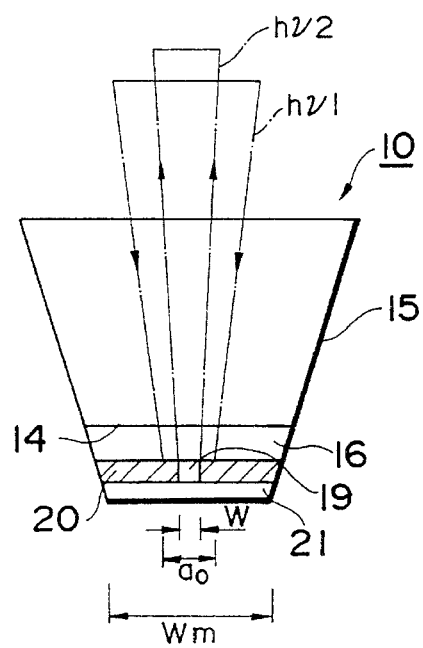

Referring to FIG. 3A and FIG. 3B, a second embodiment of the present invention is described. The same numerals as in FIGS. 2A and 2B are assigned to the same or corresponding parts in FIGS. 3A and 3B.

In FIG. 3A, a base part 15 of a quadrangular pyramid shape is made of a light transmissive material such as glass and has an infinitesimal flat face 14 at the measured object side. And a thin plate-shaped electro-optic material 16 is attached to the flat face 14. Further, as shown in vertical cross section in FIG. 3B, a light absorbing layer 20 is applied to the tip part face of the electro-optic material 16. The light absorbing layer 20 has an infinitesimal opening 19 which admits light of the incident beam hv1, and the rest of the light absorbing layer other than the opening 19 absorbs light. A reflecting mirror 21 is fixed on the other side of the light absorbing layer 20 to the tip part of the electro-optic material 16, the diameter $w_m$ of which is larger than the diameter w of the opening 19. The reflecting face of the mirror 21 faces the opening 19.

Here, a diameter w of the opening 19 is designed to be smaller than the diameter $a_0$ of the incident beam hv1 at the tip part face of the electro-optic material 16. Therefore, the substantial diameter of the reflecting face of the mirror 21 is approximately equal to w. Consequently, the beam diameter of the reflected beam hv2 reflected by the mirror is smaller than the beam diameter of the incident beam hv1. A light incident to the outside of the opening 19 or the reflecting face among the incident beam hv1 is absorbed by the light absorbing layer 20.

A beam diameter $a_0$ of the incident beam hv1 may not be able to be smaller than 1 μm due to a usage of light with a wavelength in a range of near infrared radiation in a non-contact voltage measuring apparatus as shown in FIG. 1. Even in this case, as described above, using an E-O probe 10 of the second embodiment, a diameter of a reflected beam hv2 to be modulated in the electro-optic material 16 can be about equal to a diameter w. Consequently, a spatial resolution can be set higher than a beam diameter $a_0$ of the incident beam hv1 in a conventional apparatus.

A reflecting mirror 17 or 21 as shown in FIGS. 2A and 2B, FIGS. 3A and 3B can be formed by applying fine processing technologies such as aluminum vacuum evaporation deposit conventionally known or the like. The light absorbing layer 18 or 20 is formed by applying fine processing technologies in semiconductor producing processes or the like.

Figure 4A:
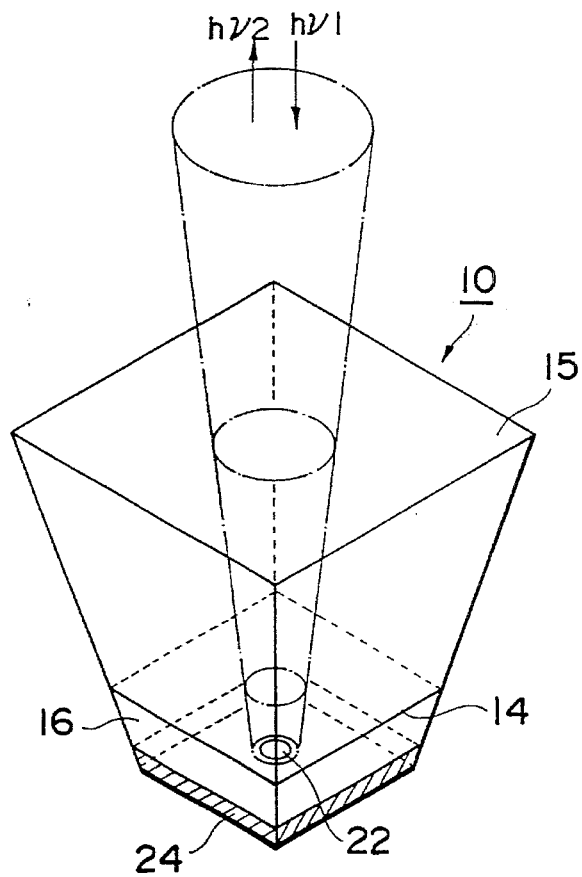
FIG. 4A and FIG. 4B are drawings describing a structure of a third embodiment of an E-O probe of the present invention.
Figure 4B:
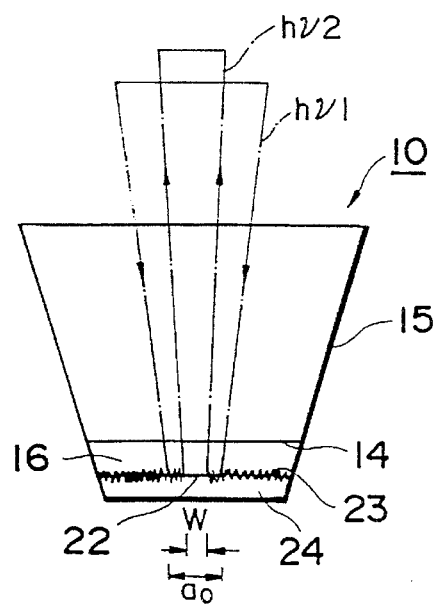

Referring to FIGS. 4A and 4B, a third embodiment of the present invention is described. The same numerals as in FIGS. 2A and 2B, FIGS. 3A and 3B are assigned to the same or corresponding parts in FIGS. 4A and 4B.

In FIG. 4A, a base part 15 of a multi-angular (quadrangular in this embodiment) pyramid shape is made of a light transmissive material such as glass and has an infinitesimal flat face 14 at the measured object side. And a thin plate shaped electro-optic material 16 is attached to the flat face 14. The shape of the electro-optic material 16 is made so as to same shape of the flat face 14. Further as shown in vertical cross section in FIG. 4B, a reflecting mirror 24 is fixed to the tip part face of the electro-optic material 16. The reflecting mirror 24 has an infinitesimal reflecting face 22 which faces an incident beam hv1 and reflects the incident beam hv1. The rest of the mirror 24 other than the reflecting face 22 is of a diffused reflection face 23.

Here, a diameter w of the mirror 22 is designed smaller than the diameter $a_0$ of the incident beam hv1 at the tip part face of the electro-optic material 16. Therefore, the beam diameter w of the reflected beam hv2 reflected by the mirror 22 is smaller than the beam diameter $a_0$ of the incident beam hv1.

Light incident to the outside of the reflecting face 22 in the incident beam hv1 is diffused by the diffused reflection face 23, and it is not involved in the reflected beam hv2.

A beam diameter $a_0$ of the incident beam hv1 may not be able to be smaller than 1 μm due to a usage of a light with a wavelength which is not attenuated in an optical system of a non-contact voltage measuring apparatus as shown in FIG. 1. Even in this case, as described above, using an E-O probe 10 of the embodiment shown in FIGS. 4A and 4B, a diameter of a reflected beam hv2 to be modulated in the electro-optic material 16 can be about equal to a diameter w. Consequently, a spatial resolution can be set higher than a beam diameter $a_0$ of the incident beam hv1 in a conventional apparatus. A separate forming of the reflecting face 22 and the diffused reflection face 23 can be realized by the following process. That is, the diffused reflection face 23 is formed first by applying fine processing technologies such as sputter etching technologies in a semiconductor producing process to the rest of the area of the electro-optic material 16 other than the prospective reflecting face 22. Then, the reflecting mirror 24 is formed all over its face by an aluminum vacuum evaporation deposit method and the like.

Figure 5:
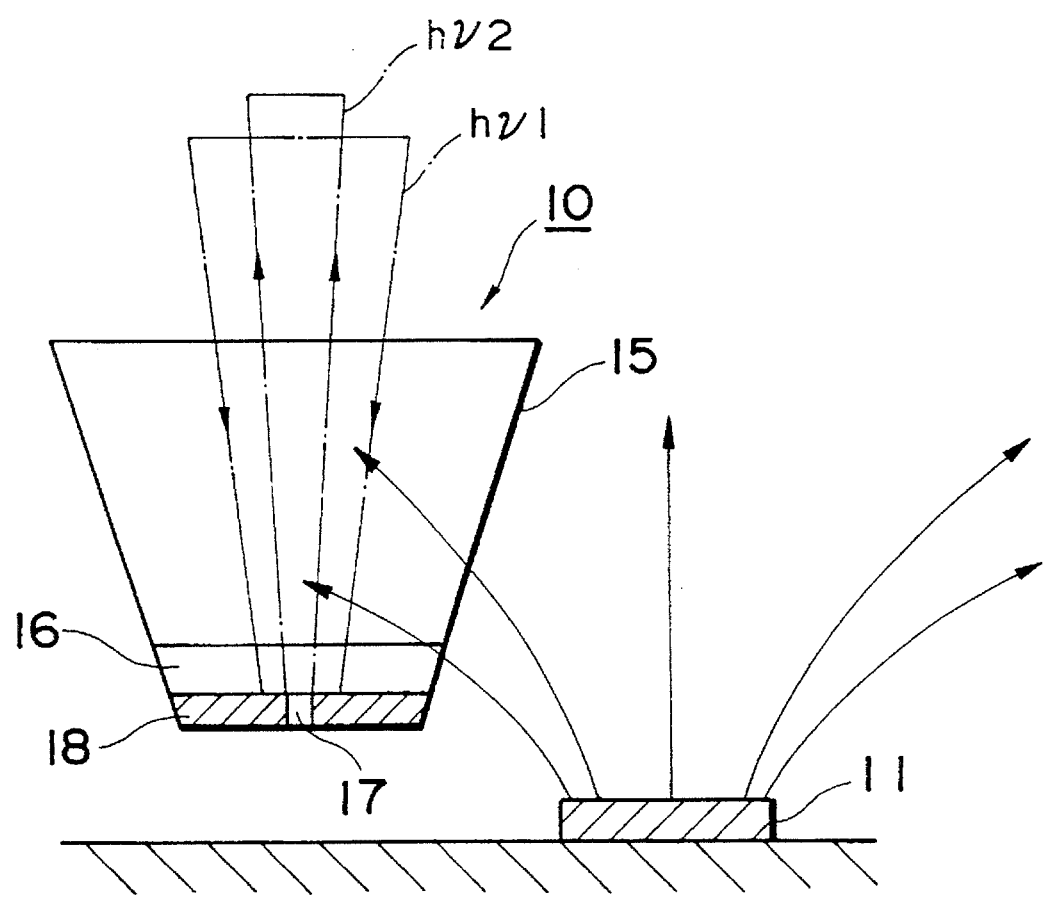
FIG. 5 is a drawing further describing a structure of an E-O probe.

In an E-O probe 10 for the embodiments shown in FIGS. 2A, 2B, 3A, 3B, 4A, 4B, 9A, and 9B, the electro-optic material 16 is made of a material as thin as possible. A very thin electro-optic material 16 can almost prevent the E-O probe from being affected by a lateral electrical field from a measured object 11 which is placed not just under the E-O probe 10 but a little aside as shown in FIG. 5, which illustrates a typical example of such an E-O probe 10. It enables an index of refraction of the electro-optic material 16 to vary sharply when a measured object 11 is shifted nearly just under the E-O probe 10, which further improves a spatial resolution. Preferably, the thickness should be same as the diameter of the reflecting mirror. In many cases, the diameter of the reflecting mirror is made the same as the theoretical minimum value based on a light wavelength used for the apparatus and the thickness of the electro-optic material is of the theoretical minimum value based on a light wavelength.

Figure 6A:
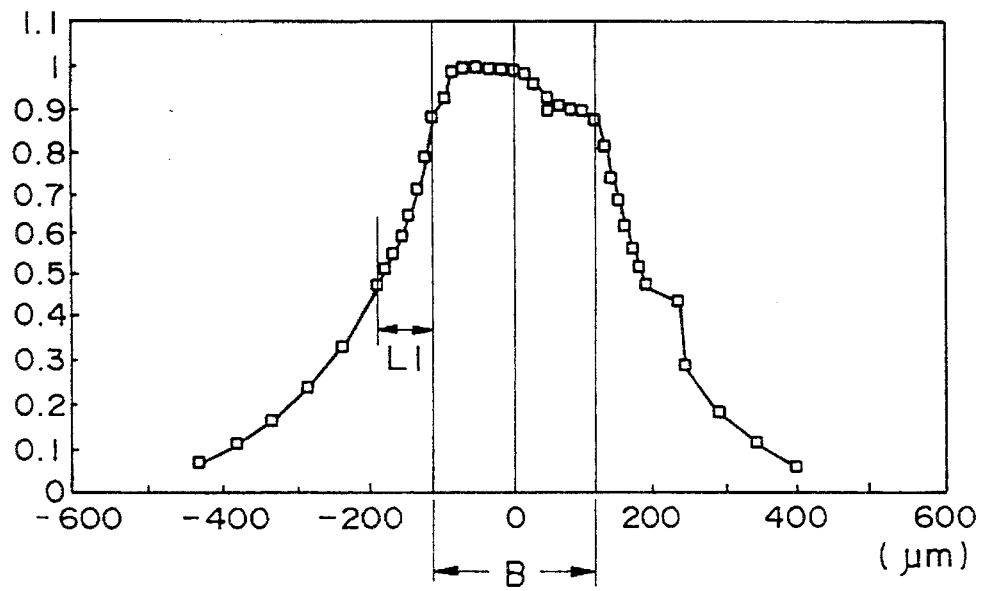
FIG. 6A and FIG. 6B show characteristic curves describing a difference due to the E-O probe thickness.
Figure 6B:
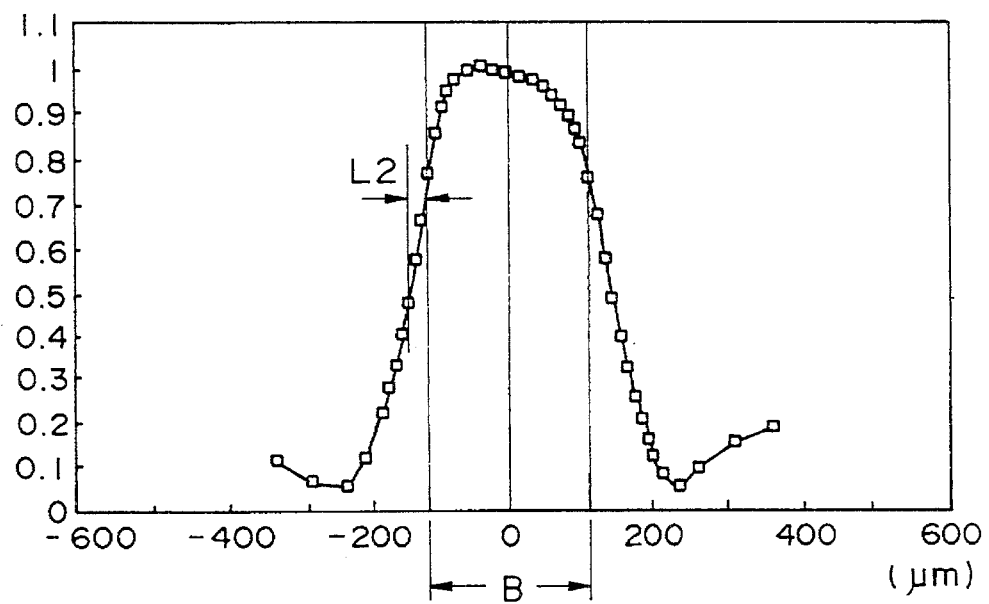
Figure 7:
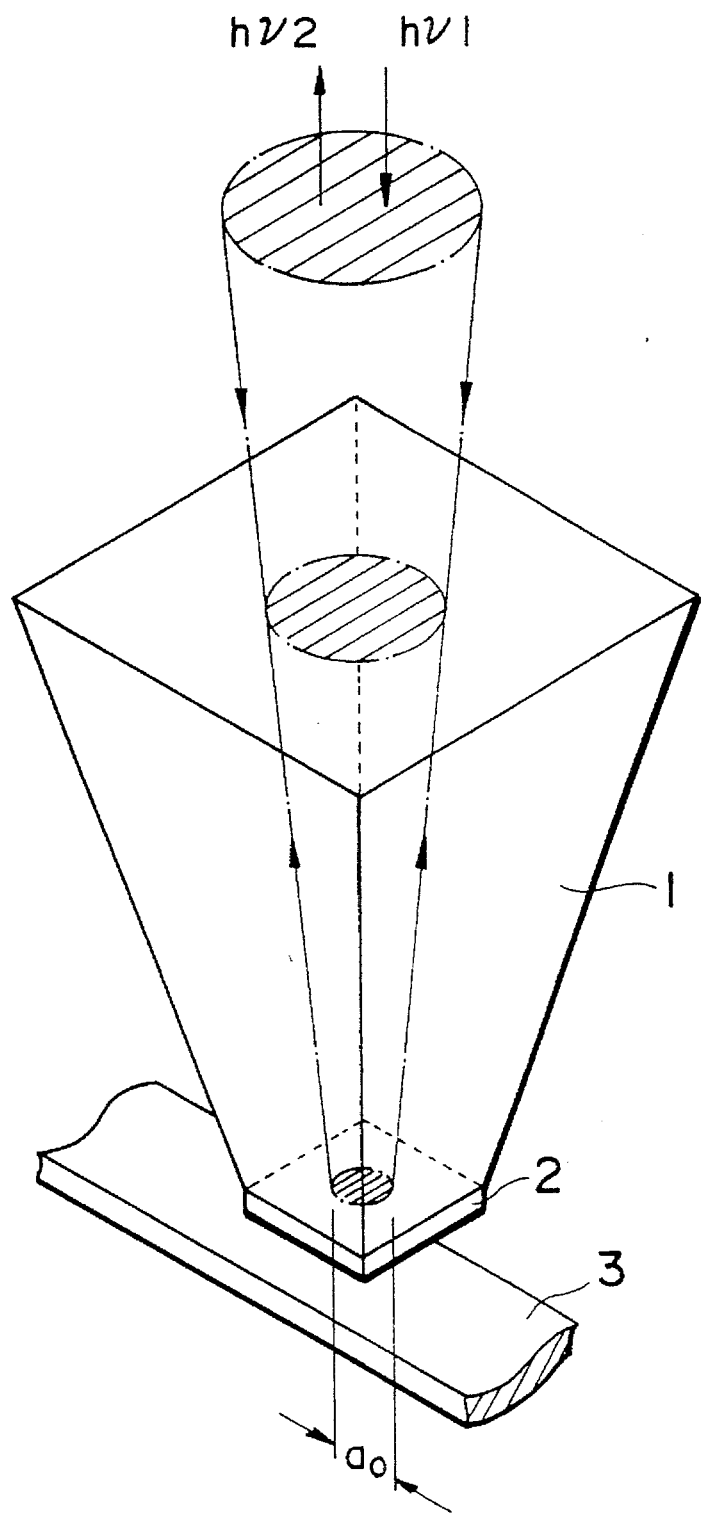
FIG. 7 is a drawing describing a structure of an E-O probe of the prior art.
Figure 8:
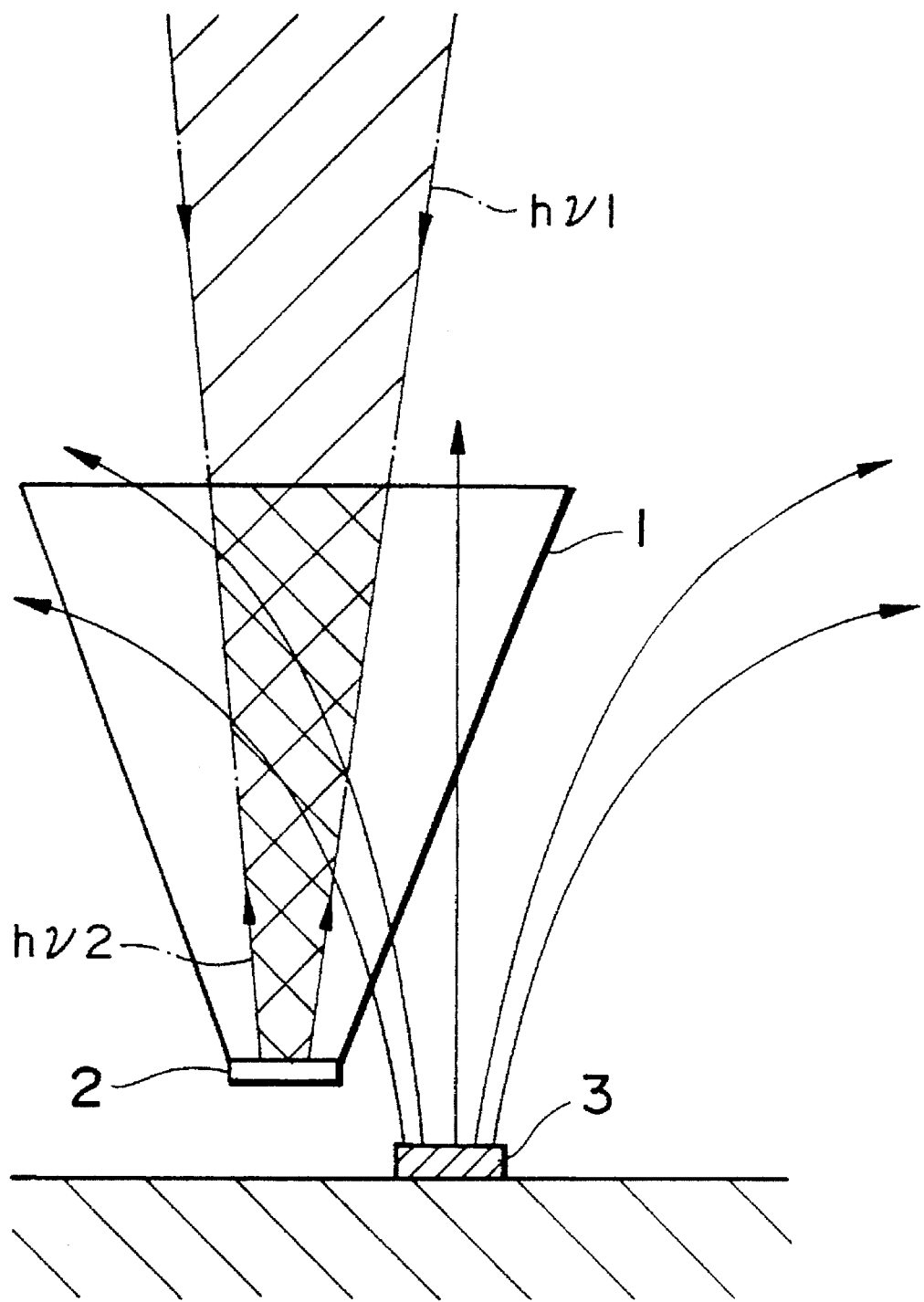
FIG. 8 is a drawing describing a problem in an E-O probe of the prior art.

FIGS. 6A and 6B show experimental results or characteristic curves describing a difference in spatial resolutions between cases of a thick electro-optic material and a thin one. In this experiment, a CW semiconductor laser is applied as a light source 4 of a non-contact voltage detecting apparatus shown in FIG. 1, a magnification of the focusing lens 9 is 10, the measured object 11 is a circuit of micro-strip line electrode with a line width B=230 μm where a predetermined voltage is given, a beam diameter of the incident beam hv1 to the electro-optic material 16 is set for 3.5 μm, the electro-optic material 16 is a crystal of ZnTe and a distance between the measured object 11 and the top end of the electro-optic material 16 is kept constant. The curve of FIG. 6A is for an electro-optic material 16 of 1 mm×1 mm and 1 mm thick, and the curve of FIG. 6B is for an electro-optic material 16 of 1 mm×1 mm and 88 μm thick. The horizontal axis indicates a distance from the point (0 point) just under the electro-optic material 16 to the center point of the measured object 11, and the vertical axis indicates a detected level by the photo-detector 12 which is normalized.

Obviously from the experimental results, a detected level varies more sharply in case of a thinner electrical material 16 (the curve of FIG. 6B) than in case of a thick one. For example, the distances L1 and L2 to the measured object 11 are compared when the detected level is 50%. The spatial resolution in case of a 1 mm thick electro-optic material 16 (the curve of FIG. 6A) is L1=67 μm, and the spatial resolution in case of a 88 μm thick electro-optic material 16 (the curve of FIG. 6B) is L2=25 μm, which indicates an obvious improvement in a spatial resolution by using a thinner electro-optic material 16.

According to the present invention as described above, an actual spatial resolution is determined by a size of the reflecting mirror since an incident beam is reflected by the smaller reflecting mirror than the incident beam in diameter even when no desired spatial resolution can attained with a beam diameter determined based on a wavelength of the incident beam ($a_0=(2\times\lambda)/(\pi\times NA)$). Conventionally a further improvement in spatial resolution is very hard since a possible beam diameter is limited by a wavelength of an applied light as an incident beam. However, according to the present invention where an incident beam is reflected by a reflecting mirror having a smaller diameter than the incident beam, spatial resolution can be improved exceeding the above-mentioned limit. Even when the minimum theoretical beam diameter cannot be attained due to an aberration or a wave front distortion of the optical elements, it little affects the spatial resolution. Forming an electro-optic material very thin, an electrical field from a measured object little affects an electro-optic material before the electro-optic material comes just over the measured object, consequently a spatial resolution can be improved.

From the foregoing description it will be apparent that there has been provided an improved E-O probe with high spatial resolution. Variations and modifications in the herein described E-O probe, within the scope of the invention, will undoubtedly suggest themselves to those skilled in the art. Accordingly, the foregoing description should be taken as illustrative and not in a limiting sense.

What is claimed is:

1. An E-O probe for measuring a voltage by applying a beam of radiation, comprising:

a base part which is penetrated by said beam of radiation;

an electro-optic material which is attached to an end face of said base part, having an index of refraction which varies in response to an intensity of an electric field; and a reflecting face formed on an end face of said electro-optic material, which reflects said beam of radiation penetrating said electro-optic material from said base part and incident on said reflecting face, wherein said beam of radiation has a predetermined thickness and the size of said reflecting face is such that a substantially entire area of said reflecting face is irradiated by said beam of radiation having said predetermined thickness, and wherein said beam of radiation is a radiation focused by an optical system including an objective lens having a numerical aperture, NA, and the size of said reflecting face is such that said substantially entire area of said reflecting face is enclosable by a circle having a diameter approximately equal to a theoretical minimum beam diameter, $(2\lambda)/(\pi NA)$, wherein $\lambda$ denotes a wave length of said beam of radiation.

2. An E-O probe according to claim 1, wherein a thickness of said electrooptical material is not larger than the same order of said theoretical minimum beam diameter, $(2\lambda)/(\pi NA)$.

3. An E-O probe according to claim 1, wherein said beam of radiation has an approximately circular cross section and the diameter of said approximately circular cross section is the same order of said theoretical minimum beam diameter, $(2\lambda)/(\pi NA)$.

4. An E-O probe according to claim 1, wherein said reflecting face is formed of a mirror.

5. An E-O probe according to claim 4, wherein said mirror is formed by a metal vacuum evaporation deposit method.

6. An E-O probe according to claim 4, further comprising a radiation absorbing layer around said mirror, said layer preventing a reflection of said beam of radiation directed to an outside of said mirror.

7. An E-O probe according to claim 1:

wherein said reflecting face is a mirror disposed on said end face of said electro-optic material, said mirror having a mirror surface and a mirror area; and wherein said E-O probe further comprises:

a light absorbing layer which is disposed between a surface of said mirror and said electro-optic material to prevent said incident beam from being reflected, and has an open area that is enclosable by said circle having a diameter approximately equal to said theoretical minimum beam diameter, wherein said mirror surface appears through said open area.

8. An E-O probe according to claim 1:

wherein said reflecting face is a mirror disposed on said end face of said electro-optic material and and having a mirror surface and a mirror area; and wherein said E-O probe further comprises:

a light diffusing layer which is disposed between said mirror surface and said end face of said electro-optic material to diffuse said incident beam, and has an open area which is enclosable by said circle having a diameter approximately equal to said theoretical minimum beam diameter, wherein said surface of said mirror appears through said open area.

9. An E-O probe according to claim 8, wherein said light diffusing layer is a sputter etched light diffusing layer.

10. An E-O probe for measuring a voltage by applying a beam of radiation, comprising:

a base part which is penetrated by said beam of radiation;

an electro-optic material which is attached to an end face of said base part, having an index of refraction which varies in response to an intensity of an electric field; and a reflecting face formed on an end face of said electro-optic material, which reflects said beam of radiation penetrating said electro-optic material from said base part and incident on said reflecting face, wherein said beam of radiation has a predetermined thickness and the size of said reflecting face is such that a substantially entire area of said reflecting face is irradiated by said beam of radiation having said predetermined thickness, wherein said end face of said electro-optic material is substantially flat and extends across a larger area than said reflecting face, said reflecting area being located on said end face of said electro-optic material, and wherein said beam of radiation is a radiation focused by an optical system including an objective lens having a numerical aperture, NA, and the size of said reflecting face is such that said substantially entire area of said reflecting face is enclosable by a circle having a diameter approximately equal to a theoretical minimum beam diameter, $(2\lambda)/(\pi NA)$, wherein $\lambda$ denotes a wave length of said beam of radiation.

11. An E-O probe according to claim 10, wherein a thickness of said electro-optic material is not larger than the same order of a theoretical minimum beam diameter, $(2\lambda)/(\pi NA)$.

12. An E-O probe according to claim 10, wherein said beam of radiation has an approximately circular cross section and the diameter of said approximately circular cross section is the same order of said theoretical minimum beam diameter, $(2\lambda)/(\pi NA)$.

13. An E-O probe according to claim 10, wherein said reflecting face is formed of a mirror.

14. An E-O probe according to claim 13, wherein said mirror is formed by a metal vacuum evaporation deposit method.

15. An E-O probe according to claim 13, further comprising a radiation absorbing layer around said mirror, said layer preventing reflection of said beam of radiation directed to an outside of said mirror.

* * * * *